(12) United States Patent
Sarrant-Foresti et al.

(10) Patent No.: US 9,316,369 B2
(45) Date of Patent: Apr. 19, 2016

(54) LUMINOUS PANEL AND BUILDING WALL

(71) Applicant: SAINT-GOBAIN PLACO, Suresnes (FR)

(72) Inventors: Maud Sarrant-Foresti, Paris (FR); Paul-Henri Guering, Paris (FR); Yves Benkemoun, Villennes sur Seine (FR)

(73) Assignee: SAINT-GOBAIN PLACO, Suresnes (FR)

( * ) Notice: Subject to any disclaimer, the term of this patent is extended or adjusted under 35 U.S.C. 154(b) by 0 days.

(21) Appl. No.: 14/382,184

(22) PCT Filed: Feb. 26, 2013

(86) PCT No.: PCT/FR2013/050387
§ 371 (c)(1),
(2) Date: Aug. 29, 2014

(87) PCT Pub. No.: WO2013/128108
PCT Pub. Date: Sep. 6, 2013

(65) Prior Publication Data
US 2015/0049468 A1 Feb. 19, 2015

(30) Foreign Application Priority Data
Feb. 29, 2012 (FR) ...................... 12 51857

(51) Int. Cl.
F21S 8/00 (2006.01)
F21V 33/00 (2006.01)
F21S 2/00 (2006.01)
F21S 8/04 (2006.01)
H01L 51/52 (2006.01)
(Continued)

(52) U.S. Cl.
CPC ............... *F21S 8/033* (2013.01); *F21S 2/005* (2013.01); *F21S 8/04* (2013.01); *F21S 8/046* (2013.01); *F21V 7/00* (2013.01); *F21V 13/04* (2013.01); *F21V 33/006* (2013.01); *H01L 25/048* (2013.01); *H01L 51/5271* (2013.01); *F21Y 2101/02* (2013.01); *F21Y 2105/008* (2013.01);
(Continued)

(58) Field of Classification Search
USPC ...................... 362/249.02, 145, 147
See application file for complete search history.

(56) References Cited

U.S. PATENT DOCUMENTS

| 6,928,775 B2 * | 8/2005 | Banister | H02S 20/25 |
| | | | 136/244 |
| 2003/0193796 A1 * | 10/2003 | Heeks | H01L 27/322 |
| | | | 362/84 |

(Continued)

FOREIGN PATENT DOCUMENTS

| EP | 1 534 049 A2 | 5/2005 |
| EP | 1 596 638 A1 | 11/2005 |

(Continued)

OTHER PUBLICATIONS

International Search Report issued May 31, 2013, in PCT/FR13/050387 filed Feb. 26, 2013.

*Primary Examiner* — Laura Tso
(74) *Attorney, Agent, or Firm* — Oblon, McClelland, Maier & Neustadt, L.L.P.

(57) ABSTRACT

A luminous panel includes at least two juxtaposed OLED devices that form a front face of the luminous panel and define two light-emitting zones separated by an intermediate zone, and a luminous joint forming mechanism that ensures, when the two OLED devices are in an on state, visual continuity between the intermediate zone and the two emitting zones, the luminous joint forming mechanism being located at a back of or flush with the front face of the panel.

20 Claims, 5 Drawing Sheets

(51) Int. Cl.
*H01L 25/04* (2014.01)
*F21V 7/00* (2006.01)
*F21V 13/04* (2006.01)
*F21Y 105/00* (2006.01)
*F21Y 101/02* (2006.01)

(52) U.S. Cl.
CPC ... *H01L 2251/533* (2013.01); *H01L 2251/5361* (2013.01); *H01L 2924/0002* (2013.01)

(56) References Cited

U.S. PATENT DOCUMENTS

| | | |
|---|---|---|
| 2005/0111211 A1 | 5/2005 | Takeuchi |
| 2005/0253492 A1 | 11/2005 | Besshi et al. |
| 2008/0232093 A1 | 9/2008 | Kim |
| 2010/0284173 A1 | 11/2010 | Verjans et al. |
| 2010/0284185 A1 | 11/2010 | Ngai |
| 2011/0157893 A1* | 6/2011 | Ngai .................. F21S 2/00 362/249.02 |

FOREIGN PATENT DOCUMENTS

| | | |
|---|---|---|
| JP | 2009-259559 | 11/2009 |
| WO | WO 2009/087585 A1 | 7/2009 |
| WO | WO 2010/032596 A1 | 3/2010 |
| WO | WO 2010/129717 A1 | 11/2010 |

* cited by examiner

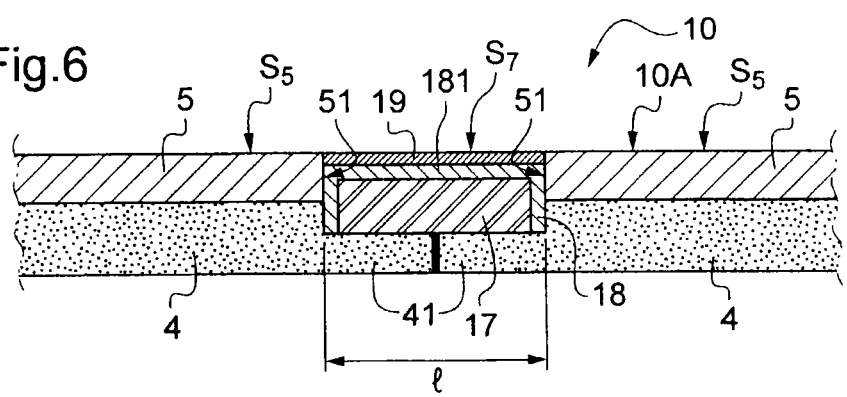
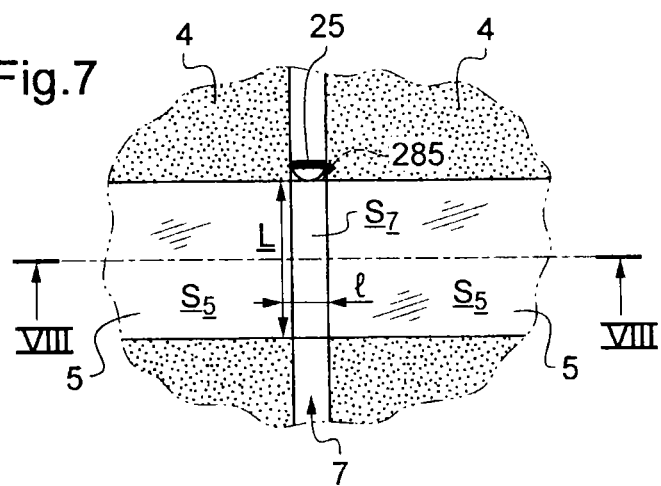
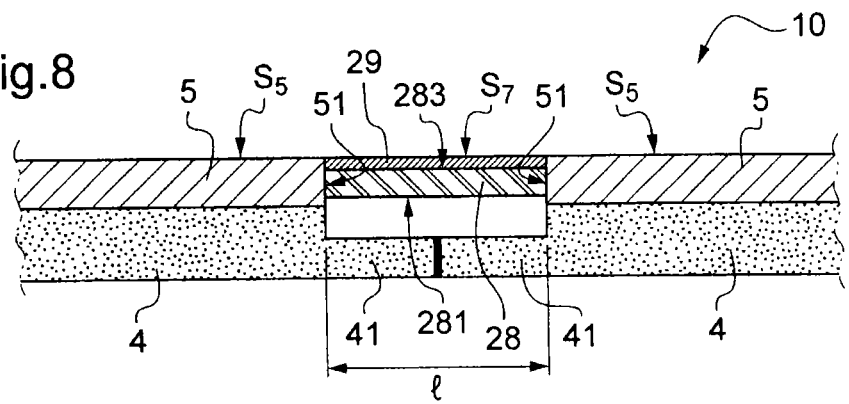

LUMINOUS PANEL AND BUILDING WALL

BACKGROUND

The present invention relates to a luminous panel and to a building wall comprising such a luminous panel, especially as a structural element of the wall. In particular, the luminous panel may be employed as a cladding panel for an internal wall or a ceiling.

It is known to produce small luminaires using organic light-emitting diodes (OLEDs), which OLEDs are able to convert electrical energy into radiation. An OLED functional element comprises a stack of organic light-emitting layers inserted between two electrically conductive contacts forming front and back electrodes. An OLED functional element is conventionally encapsulated between two, front and back, protective substrates in order to form an OLED device. At least the front electrode of the OLED is transparent and likewise the protective first substrate, in order to allow the radiation emitted by the stack of light-emitting layers to exit through the front face of the OLED device. The transparent electrode may especially be based on a transparent conductive oxide (TCO) layer or on a transparent metal layer. The front and back protective substrates may especially be made of glass or of an organic polymer that is rigid or flexible. A flexible OLED device, in which the OLED is encapsulated between flexible polymer substrates rather than rigid substrates has the advantage of being thin, pliable and light.

An OLED device, whether rigid or flexible, may be associated, for example by adhesive bonding, with a support taking the form of a board so as to form a luminous board. The luminous board may be obtained by covering the support with a single OLED device or, when the size of the desired luminous area on the support exceeds the maximum available OLED device size, by covering the support with a plurality of juxtaposed OLED devices. Advantageously, the support used to form the luminous board is a structural element of a building wall, such as a cladding panel of an internal wall or a ceiling. It is then possible, by positioning a number of luminous boards on a conventional framework system of an internal wall or a ceiling, to obtain a large luminous wall capable of playing a double role as a wall and as a luminaire.

However, in such a luminous wall, there exists a visual discontinuity in each junction zone between two juxtaposed luminous boards, where systems for filling gaps between two cladding panels are conventionally placed. In the case where a luminous board is obtained by juxtaposing a plurality of OLED devices on one face of a support, there is also a visual discontinuity in each junction zone between two juxtaposed OLED devices on the support. These visual discontinuities take the form, in particular when the luminous wall is in the "on" state, of intermediate dark bands that do not emit light, which bands degrade the appearance of the luminous wall.

BRIEF SUMMARY

It is these drawbacks that the invention more particularly intends to overcome by providing a luminous panel, especially intended to be integrated into a building wall, that has an improved appearance both when the panel is in the "off" state and in the "on" state.

For this purpose, one subject of the invention is a luminous panel comprising at least two juxtaposed OLED devices that form a front face of the luminous panel and define two light-emitting zones separated by an intermediate zone, characterized in that it comprises luminous joint forming means that ensure, when the two OLED devices are in the "on" state, visual continuity between the intermediate zone and the two emitting zones, the luminous joint forming means being located at the back of or flush with the front face of the luminous panel.

In the context of the invention, a direction from the back to the front of the luminous panel is defined as extending in the emission direction of the OLED devices. Thus, a first element is located at the back of a second element when the path from the first element to the second element has a component that extends in the emission direction of the OLED devices. Moreover, within the context of the invention, an element is considered to be flush with the front face of the luminous panel when it has an excess thickness, relative to this face, of 2 mm or less, preferably 1 mm or less, more preferably 0.5 mm or less, and even more preferably 0 mm.

Preferably, the luminous joint forming means are positioned in the thickness of the luminous panel.

Advantageously, each OLED device is joined to a structural element of a building wall, especially a cladding panel of a wall or a ceiling, so that the luminous panel may be positioned directly in a conventional framework system of a wall or a ceiling. This in particular allows a large luminous wall to be easily obtained, which is capable of playing a double role as a wall and as a luminaire.

According to other advantageous and optional features of the invention, to be applied individually or in any technically possible combination:

When the two OLED devices are in the "on" state, the relative difference in luminance $\Delta L/L_m$ between the intermediate zone and each of the two emitting zones is smaller than 10%, preferably smaller than 5%, even more preferably smaller than 1%. The relative difference in luminance is defined as the ratio $\Delta L/L_m$, where $\Delta L$ is the mean difference in luminance between the two zones for a given nonzero intensity setpoint, and $L_m$ is the mean luminance of each emissive zone for said given intensity setpoint. The mean luminance considered in the "on" state is that expressed in the CIE (L, u', v') color coordinate system. Specifically the CIE (L, u', v') color coordinate system has, relative to the CIE (L, x, y) color coordinate system, the advantage of better uniformity. The (L, u', v') system is therefore better suited to evaluating color differences between two zones in the "on" state, acting as two primary sources.

When the two OLED devices are in the "on" state, the (u', v') color coordinates of the intermediate zone are inside the MacAdam ellipse centered on the (u', v') color coordinates of each of the two emitting zones. The use of MacAdam ellipses is relevant for measuring the perceptible difference between two colors in the "on" state. The equation of these ellipses takes the form $ds^2 = g_{11} \Delta u'^2 + 2 g_{12} \Delta u' \Delta v' + g_{22} \Delta v'^2$, where the parameters $g_{11}$, $g_{12}$ and $g_{22}$ are determined in the conventional way by applying the results of the initial studies of MacAdam (J. Opt. Soc. Am., 32, 247-274, 1942 and J. Opt. Soc. Am., 39, 808-834, 1949).

The maximum width of the intermediate zone, measured perpendicularly to the adjacent edges of the emitting zones, is smaller than or equal to 2 cm, preferably smaller than or equal to 1 cm, even more preferably smaller than or equal to 0.5 cm.

The luminous panel comprises a covering of the intermediate zone such that, when the two OLED devices are in the "off" state, there is visual continuity between the intermediate zone and the two emitting zones.

When the two OLED devices are in the "off" state, the relative difference in luminance $\Delta L/L_m$ between the intermediate zone and each of the two emitting zones is smaller than 10%, preferably smaller than 5%, even more preferably smaller than 1%. The relative difference in luminance is defined as the ratio $\Delta L/L_m$, where $\Delta L$ is the mean difference in luminance between the two zones for a given zero intensity setpoint, and $L_m$ is the mean luminance of each emissive zone for said zero intensity setpoint. The mean luminance considered in the "off" state is that expressed in the CIE (L, a*, b*) color coordinate system. Specifically, in the "off" state, the two zones act as secondary sources that partially re-emit ambient light. The (L, a*, b*) system is well suited to evaluating color differences between two secondary sources.

When the two OLED devices are in the "off" state, the color difference $\Delta E$ between the intermediate zone and each of the two emitting zones is smaller than 2, preferably smaller than 1. In the "off" state, the color difference $\Delta E$ between two zones is defined by the following expression (1) using the CIE (L, a*, b*) color coordinate system:

$$\Delta E = \sqrt{(\Delta L)^2 + (\Delta a^*)^2 + (\Delta b^*)^2} \tag{1}$$

where $\Delta L$ is the mean difference in luminance between the two zones for a zero intensity setpoint;

$\Delta a^*$ is the difference in the colorimetric quantity a* between the two zones for said zero intensity setpoint;

$\Delta b^*$ is the difference in the colorimetric quantity b* between the two zones for said zero intensity setpoint.

In a first embodiment, the luminous panel comprises a support, especially a cladding panel of an internal wall or a ceiling, on one face of which the two OLED devices are juxtaposed.

In a second embodiment, the luminous panel comprises two juxtaposed supports, especially two cladding panels of an internal wall or a ceiling, each support being covered with one of the two OLED devices.

In the above two embodiments, the luminous joint forming means may be fastened to at least one OLED device support.

As a variant, in the second of the above embodiments, where the luminous panel comprises two juxtaposed supports each covered with one of the two OLED devices, the luminous joint forming means may be fastened to a framework element allowing one or each OLED device support to be fastened to a bearing structure. The framework element may be located at the back of the OLED device supports or it may be located at the front of the OLED device supports. In the latter case, the framework element may especially be a T-shaped profile, where the horizontal bar of the T-shaped profile bears against the front faces of thinned edges of the two juxtaposed supports whereas the vertical bar of the T-shaped profile passes between the two supports in order to be connected, at the back of the supports, to the bearing structure supporting the luminous panel.

The luminous joint forming means comprise a light-emitting strip placed in, or at the back of, the intermediate zone, control of the "on"/"off" state of the light-emitting strip being slaved to that of the two OLED devices.

The luminous joint forming means comprise scattering means for scattering light emitted by a light source toward the front of the intermediate zone.

The light source comprises at least one of the two OLED devices, the scattering means comprising a redirecting element for redirecting the light emitted by the OLED device toward the front of the intermediate zone.

The redirecting element comprises at least one light-reflective surface that is positioned, at the back of the intermediate zone, facing one edge of said OLED device. In this case, the maximum width of the intermediate zone, measured perpendicularly to the adjacent edges of the two emitting zones, is advantageously smaller than or equal to 2 mm, preferably smaller than or equal to 1 mm, even more preferably smaller than or equal to 0.5 mm.

The reflective surface is inclined relative to the edge of said OLED device so as to get further away from the edge in the direction of the intermediate zone.

The redirecting element is a prism placed at the back of the intermediate zone between two adjacent edges of the two juxtaposed OLED devices, a first reflective surface of the prism facing the edge of one of the two OLED devices whereas a second reflective surface of the prism faces the edge of the other OLED device. In practice, each reflective surface of the prism may be a surface equipped with a light-reflecting coating or a coating that redirects light by scattering it, for example a white coating with a high albedo, especially 80% or higher. As a variant, each reflective surface of the prism may reflect light by total reflection, which may be obtained by adjusting the refractive index of the constituent material of the prism and the angle of incidence of the light on the surface.

The redirecting element is a machined portion of a support of at least one of the two OLED devices, this machined portion forming the reflective surface. In particular, the support may be a cladding panel of an internal wall or a ceiling, the machined portion of the support then advantageously being equipped, in order to form the reflective surface, with a light-reflecting coating or a coating that redirects light by scattering it, for example a white coating with a high albedo, especially 80% or higher.

The light source is an external source coupled to the edge face of a scattering plate, the scattering plate being placed in or at the back of the intermediate zone, a main face of the scattering plate oriented toward the front of the intermediate zone being able to extract at least some of the light emitted by the external light source.

The scattering plate comprises, on one of its main faces, a pattern for extracting light emitted by the external light source, especially a screen-printed extracting pattern, guaranteeing uniform luminance over the entire intermediate zone area.

The present invention also relates to a building wall, especially an internal wall or a ceiling comprising a luminous panel such as described above.

Advantageously, a building wall according to the invention comprises a luminous panel that includes:

at least one structural element of the building wall, especially a cladding panel for a wall or a ceiling; and at least two juxtaposed OLED devices that form a front face of the luminous panel and define two light-emitting zones separated by an intermediate zone, where each OLED device is joined to a structural element of the building wall, especially to a cladding panel for a wall or a ceiling, the luminous panel furthermore comprising luminous joint forming means that ensure, when the two OLED devices are in the "on" state, visual continuity between the intermediate zone and the two emitting zones, the luminous joint forming means being located at the back of, or flush with, the front face of the luminous panel.

BRIEF DESCRIPTION OF THE DRAWINGS

Features and advantages of the invention will become apparent from the following description of several embodiments of a luminous panel according to the invention, which description is given merely by way of example and with reference to the appended drawings, in which:

FIG. 6 is an analogous view to FIG. 3 for a second embodiment of the luminous panel;

FIG. 7 is a view at a larger scale of the detail VII in FIG. 1 for a third embodiment of the luminous panel;

FIG. 8 is a cross-section at a larger scale along the line VIII-VIII in FIG. 7;

DETAILED DESCRIPTION

FIGS. 1 to 13 are schematic. In particular, for the sake of visibility, the relative dimensions shown in these figures for the various constituent elements of the internal wall are not strictly accurate.

Figure 1:
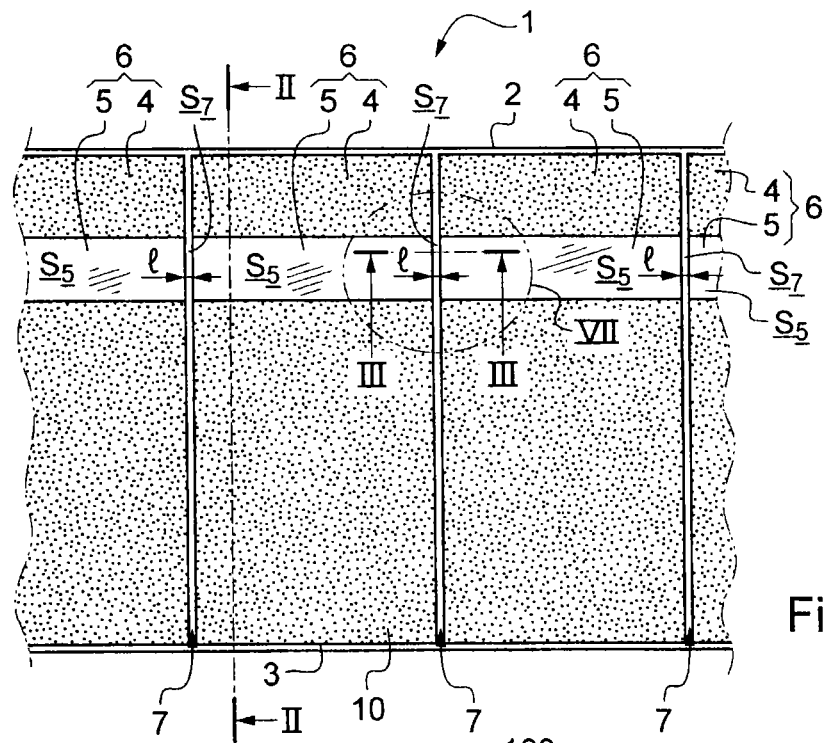
FIG. 1 is a partial front view of a building internal wall comprising a luminous panel according to the invention.
Figure 2:
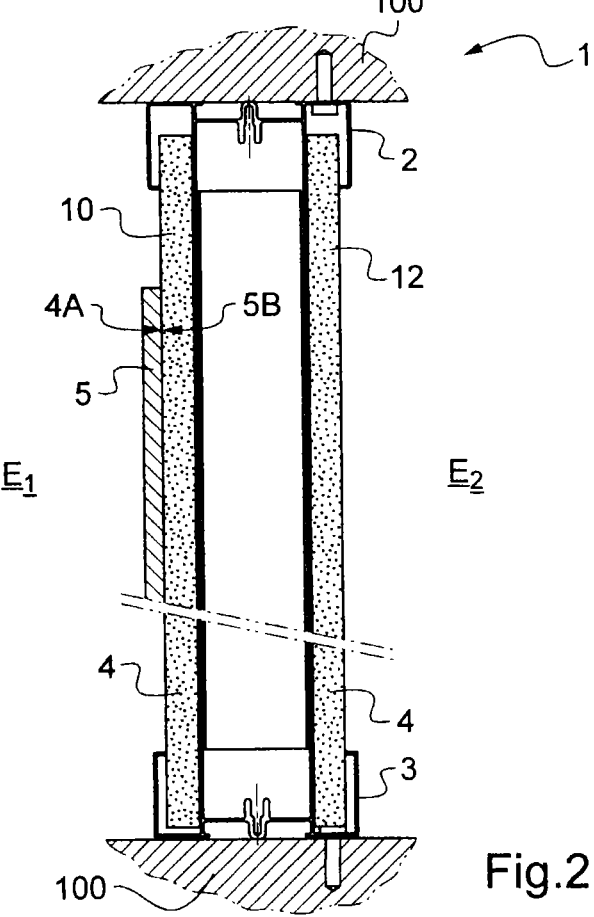
FIG. 2 is a cross section along the line II-II in FIG. 1.

FIGS. 1 and 2 show a demountable internal wall 1. The internal wall 1 comprises a bottom rail 2 and a top rail 3 that are connected to a bearing structure 100 supporting the wall, vertical pillars (not shown), and cladding panels 4 that are for example plasterboards such as those called BA13 plasterboards. As may be clearly seen in FIG. 2, the cladding panels 4 are positioned in the framework of the wall in order to form two panels 10 and 12 that lie substantially parallel to each other and that act as walls for, respectively, a space E1 and a space E2 bounded by the internal wall.

As shown in FIG. 1, the cladding panels 4 of the panel 10 are covered, in an upper part of their face oriented toward the space E1, with OLED devices 5. The OLED devices 5 may be of any type, in particular they may be rigid or flexible. These OLED devices 5 are supplied with electrical power by any means known to those skilled in the art, and this supply can be controlled via one or more switches in order to adjust the lighting in the space E1. Thus, by virtue of its luminous panel 10, the internal wall 1 plays, in the space E1, a double role, acting as a wall and as a luminaire.

Each OLED device 5 is joined to the corresponding cladding panel 4 by any appropriate means, especially by adhesively bonding a back face 5B of the OLED device 5 to a main face 4A of the panel 4, the assembly forming a luminous board 6. When the internal wall 1 is in its fitted configuration, the OLED devices 5 of the various luminous boards 6 of the panel 10 are juxtaposed so as to form a large continuous luminous area. In this example, all the OLED devices 5 of the panel 10 have the same optical properties, especially in terms of colorimetric characteristics, so that the luminous area of the panel 10 is homogeneous from one OLED device 5 to another.

Each junction region 7 between two adjacent luminous boards 6 of the panel, where systems for filling gaps between two cladding panels are conventionally placed, does not emit light. More precisely, for each junction region 7, the two OLED devices 5 positioned on either side of this region form the front face 10A of the luminous panel 10 and define on this front face 10A, which is oriented toward the space E1, two light-emitting zones $S_5$ separated by an intermediate zone $S_7$ that does not emit light. Each intermediate zone $S_7$ has a maximum width l, measured perpendicularly to the adjacent edges of the emitting zones $S_5$, smaller than or equal to 2 cm, preferably smaller than or equal to 1 cm, even more preferably smaller than or equal to 0.5 cm.

In order to provide the panel 10 with a uniform appearance when two adjacent OLED devices 5 are in the "on" state, luminous joint forming means are provided in each intermediate zone $S_7$. These luminous joint forming means are chosen in order to ensure, when two adjacent OLED devices are in the "on" state, that the relative difference in luminance $\Delta L/L_m$ between the intermediate zone $S_7$ and each of the two emitting zones $S_5$ flanking it is less than 10%, preferably less than 5%, more preferably less than 1%, and that the coordinates (u', v') of the intermediate zone $S_7$ are inside the MacAdam ellipse centered on the coordinates (u', v') of each of the two emitting zones $S_5$.

In order to provide the panel 10 with a uniform appearance when two adjacent OLED devices 5 are in the "off" state, the luminous joint forming means are also chosen to ensure, when two adjacent OLED devices 5 are in the "off" state, that the relative difference in luminance $\Delta L/L_m$ between the intermediate zone $S_7$ and each of the two emitting zones $S_5$ is less than 10%, preferably less than 5%, more preferably less than 1%, and that the color difference $\Delta E$ between the intermediate zone $S_7$ and each of the two emitting zones $S_5$ is smaller than 2, preferably smaller than 1. When the OLED devices are in the "off" state, the relative difference in luminance $\Delta L/L_m$ corresponds to the relative difference in reflection coefficient between the intermediate zone $S_7$ and each of the two emitting zones $S_5$.

Furthermore, in order not to degrade the uniformity of the surface of the front face 10A of the panel 10, the luminous joint forming means are chosen to be located at the back of or flush with this front face 10A.

Example embodiments of the luminous joint forming means between two OLED devices 5 of the luminous panel 10 are shown in FIGS. 3 to 6.

Figure 3:
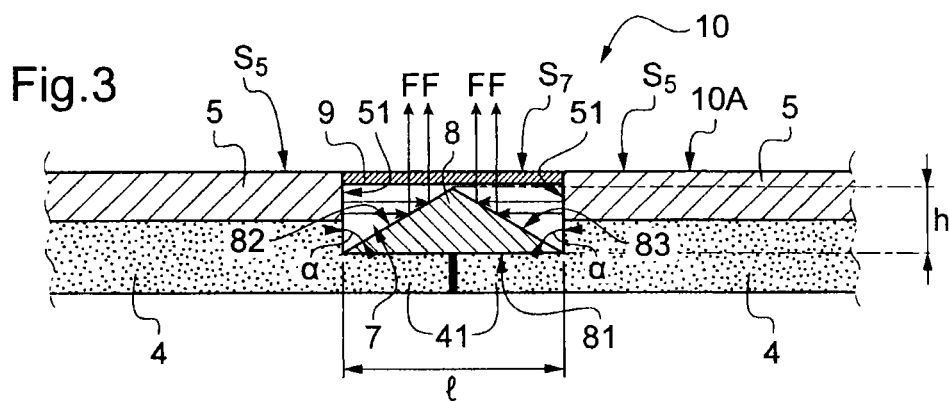
FIG. 3 is a cross section at a larger scale along the line III-Ill in FIG. 1 for a first embodiment of the luminous panel.

In the first embodiment shown in FIG. 3, the luminous joint forming means comprise a reflective prism 8 placed in the junction zone 7 at the back of the intermediate zone $S_7$. Advantageously, each cladding panel 4 of the panel 10 has thinned edges 41 at the junction with the adjacent cladding panels 4. As may clearly be seen in FIG. 3, in each junction region 7 the thinned edges 41 of the two adjacent panels 4 protrude relative to the edges 51 of the OLED devices 5. The prism 8 is positioned between the edges 51 of the OLED devices 5, with its base 81 resting on the thinned edges 41 so that a first reflective surface 82 of the prism faces the edge 51 of one of the OLED devices 5, whereas a second reflective surface 83 of the prism faces the edge 51 of the other OLED device 5.

Each reflective surface 82 or 83 of the prism 8 is inclined at an angle α of about 45° relative to the edge 51 of the OLED device opposite which it is placed, so as to get further away from the edge in the direction of the intermediate zone $S_7$. The prism 8 may be made of a completely reflective material or of a semi-reflective or transparent material that is provided on its surface with a film that redirects light. The height h of the prism 8 is tailored such that the prism 8 fits between the edges 51 while remaining at the back of or flush with the front face 10A of the luminous panel.

By virtue of this arrangement, the prism 8 allows the light emitted from the edges 51 of the OLED devices 5 to be redirected toward the front of the intermediate zone $S_7$, as shown by the arrows F in FIG. 3. The OLED devices are Lambertian emitters, i.e. they emit light in every direction in space. Thus, the light flux redirected toward the front of the intermediate zone $S_7$ by the prism 8 adds to the light flux emitted by the two OLED devices in every direction in space, thereby allowing visual continuity to be ensured between the intermediate zone $S_7$ and the two emitting zones $S_5$ when the two OLED devices 5 are in the "on" state.

In this first embodiment, the luminous joint forming means also comprise a film 9 as a coating of the intermediate zone $S_7$, which film is positioned at the front of the junction region 7 and flush with the front face 10A of the luminous panel 10. This film 9 is intended to ensure visual continuity between the intermediate zone $S_7$ and the two emitting zones $S_5$ when the two OLED devices 5 are in the "off" state, and is chosen so as to meet the aforementioned criteria for relative difference in luminance $\Delta L/L_m$ and for color difference $\Delta E$ when the two OLED devices 5 are in the "off" state. By way of example, when the front faces of the two OLED devices 5 are semi-reflective in the "off" state, the film 9 may be a semi-reflective film. The assembly comprising the prism 8 and the film 9 is also optimized in order to meet the aforementioned criteria for relative difference in luminance $\Delta L/L_m$ and for color difference determined from the MacAdam ellipses in the "on" state of the two OLED devices 5.

Figure 4:
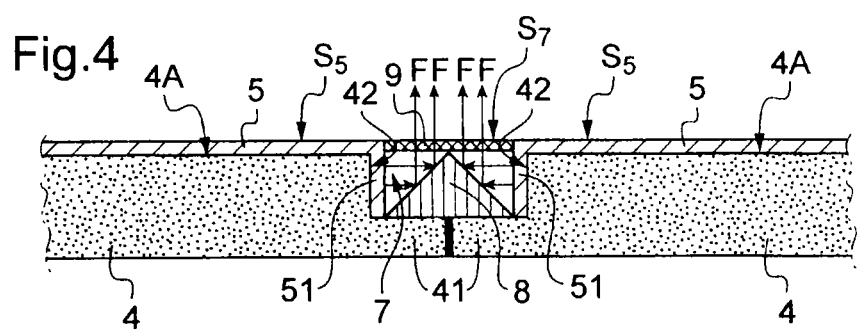
FIG. 4 is an analogous view to FIG. 3 for a variant of the first embodiment.
Figure 5:
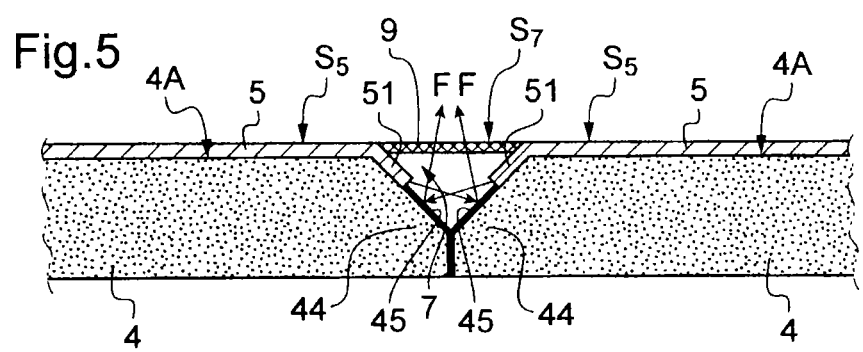
FIG. 5 is an analogous view to FIG. 3 for another variant of the first embodiment.

FIGS. 4 and 5 show two variants of the embodiment of FIG. 3, in which variants the two juxtaposed OLED devices 5 are flexible OLED devices. In these variants, each flexible OLED device 5 extends over the main face 4A of the corresponding cladding panel 4 and is folded laterally into the junction zone 7 in the direction of the thinned edges 41 of the panel 4, each time along a face 42 of the panel 4 connecting the main face 4A and the thinned edge 41.

In the variant in FIG. 4, the prism 8 is positioned between the edges 51 of the OLED devices 5 folded along the faces 42, with its base 81 resting on the thinned edges 41 so that a first reflective surface 82 of the prism faces the folded edge 51 of one of the OLED devices 5, whereas a second reflective surface 83 of the prism faces the folded edge 51 of the other OLED device 5. This configuration is more compact than that in FIG. 3.

In the variant in FIG. 5, the reflective prism 8 is replaced by machined portions 44 machined in each of the two panels 4 carrying the flexible OLED devices 5, these machined portions 44 each being equipped, in order to form reflective surfaces, with a coating 45 that reflects light or redirects it by scattering, for example a white coating with a high albedo, especially 80% or higher. The two machined portions 44 equipped with their coatings 45 thus allow, in a way similar to the prism 8, light emitted from the folded edges 51 of the OLED devices 5 to be redirected toward the front of the intermediate zone $S_7$, as shown by the arrows F in FIG. 5.

In the second embodiment shown in FIG. 6, the luminous joint forming means comprise a light-emitting strip 18 placed at the back of the intermediate zone $S_7$. In the same way as above, each cladding panel 4 comprises thinned edges 41 that protrude relative to the edges 51 of the OLED devices 5, and the light-emitting strip 18 is positioned between the edges 51 of the OLED devices 5. More precisely, the light-emitting strip 18 is folded into a U shape around a filling block 17 positioned bearing against the thin end edges 41, the part 181 of the strip 18 that forms the bottom of the U being oriented toward the intermediate zone $S_7$. The light-emitting strip 18 may for example be a strip of flexible OLED device or an inorganic light-emitting strip. As shown in FIG. 4, the part 181 of the light-emitting strip 18 has a width corresponding to the entire width l of the intermediate zone $S_7$. As a variant, the light-emitting strip 18 may cover a width corresponding to a fraction of the width l of the intermediate zone $S_7$. Preferably, the light-emitting strip 18 covers between 50% and 100% of the width l of the intermediate zone $S_7$.

When the light-emitting strip 18, in its "off" state, meets the aforementioned criteria for relative difference in luminance $\Delta L/L_m$ and for color difference $\Delta E$ in the "off" state of the two OLED devices 5, it is advantageously configured so as to lie flush with the front face 10A of the luminous panel 10. In addition, the light-emitting strip 18 is chosen so as to meet, in its "on" state, the aforementioned criteria for relative difference in luminance $\Delta L/L_m$ and for color difference determined from the MacAdam ellipses in the "on" state of the two OLED devices 5. The light-emitting strip 18 thus allows visual continuity between the intermediate zone $S_7$ and the two emitting zones $S_5$ to be ensured when the two OLED devices 5 and the light-emitting strip 18 are in the "on" state. Advantageously, control of the "on"/"off" state of the light-emitting strip 18 is slaved to the "on"/"off" state of the two OLED devices such that the light-emitting strip 18 is turned on only when the OLED devices flanking it are both turned on.

When the light-emitting strip 18, in its "off" state, does not meet the aforementioned criteria for relative difference in luminance $\Delta L/L_m$ and for color difference $\Delta E$ in the "off" state of the two OLED devices 5, the luminous joint forming means comprise, in addition to the light-emitting strip 18, a film 19 forming a coating of the intermediate zone $S_7$, which film is positioned in front of the light-emitting strip 18 flush with the front face 10A of the luminous panel 10, as shown in FIG. 4. The stack of the light-emitting strip 18 and the film 19 is chosen so that the aforementioned criteria for relative difference in luminance $\Delta L/L_m$ and for color difference $\Delta E$ are met when the two OLED devices 5 and the light-emitting strip 18 are in the "off" state, so as to ensure visual continuity between the intermediate zone $S_7$ and the two emitting zones $S_5$ in the "off" state. In addition, the stack of the light-emitting strip 18 and the film 19 is chosen so that the aforementioned criteria for relative difference in luminance $\Delta L/L_m$ and for color difference $\Delta E$ determined from the MacAdam ellipses are met when both the two OLED devices 5 and the light-emitting strip 18 are in the "on" state, so as to ensure visual continuity between the intermediate zone $S_7$ and the two emitting zones $S_5$ in the "on" state.

In the third embodiment shown in FIGS. 7 and 8, the luminous joint forming means comprise a system for providing illumination via the edge face, formed by associating a scattering plate 28 with an external light source 25 able to inject light into the scattering plate 28 via an edge face 285 of said strip. In the same way as above, each cladding panel 4 comprises thinned edges 41 that protrude relative to the edges 51 of the OLED devices 5. The scattering plate 28 is positioned making contact with the edges 51 of the OLED devices 5, with its back face 281 placed facing the thinned edges 41. The front face 283 of the scattering plate 28 is able to extract at least some of the light emitted by the external source 25. To this end, the scattering plate 28 comprises, on its back face 281, a light extracting pattern. By way of example, the external source 25 is a light-emitting diode (LED) and the scattering plate 28 is a transparent plate, made of glass or of an organic polymer, comprising, on one of its faces, a series of screen-printed points forming an extraction gradient that ensures uniform light extraction along the junction region 7.

In the same way as above, the luminous joint forming means also comprise a film 29 forming a coating of the intermediate zone $S_7$, which film is positioned in front of the scattering plate 28 flush with the front face 10A of the luminous panel 10. The stack of the scattering plate 28 and the film 29 is chosen so that the aforementioned criteria for relative difference in luminance $\Delta L/L_m$ and for color difference $\Delta E$ are met when the two OLED devices 5 and the external light source 25 are in the "off" state, so as to ensure visual continuity between the intermediate zone $S_7$ and the two emitting zones $S_5$ in the "off" state. In addition, the stack of the scattering plate 28 and the film 29 is chosen so that the aforementioned criteria for relative difference in luminance $\Delta L/L_m$ and for color difference determined from the MacAdam ellipses are met when both the two OLED devices 5 and the external light source 25 are in the "on" state, so as to ensure visual continuity between the intermediate zone $S_7$ and the two emitting zones $S_5$ in the "on" state. Advantageously, control of the "on"/"off" state of the external source 25 is slaved to that of the two OLED devices such that the external source 25 is turned on only when the OLED devices flanking the scattering plate 28 are both turned on.

Figure 9:
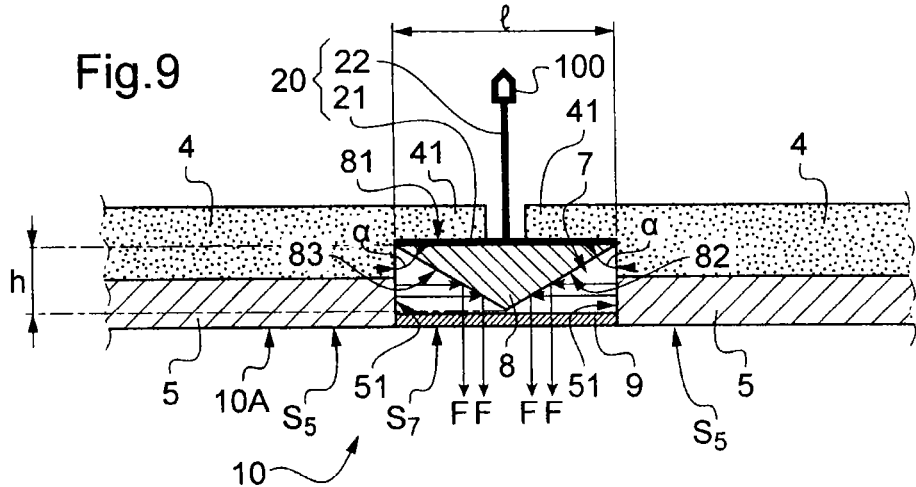
FIGS. 9, 10, 11 are analogous views to FIGS. 3, 4, 6, respectively, illustrating the case where the luminous joint forming means are fastened not directly to the supports of the OLED devices, but to framework elements that allow the OLED device supports to be fastened to a bearing structure supporting the luminous panel.
Figure 10:
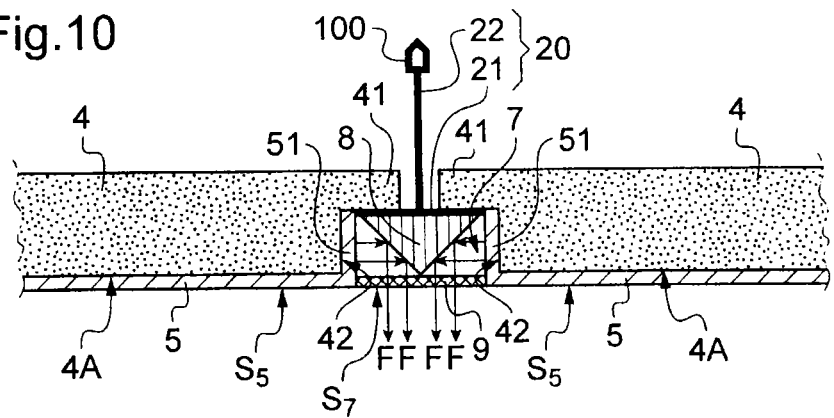
Figure 11:
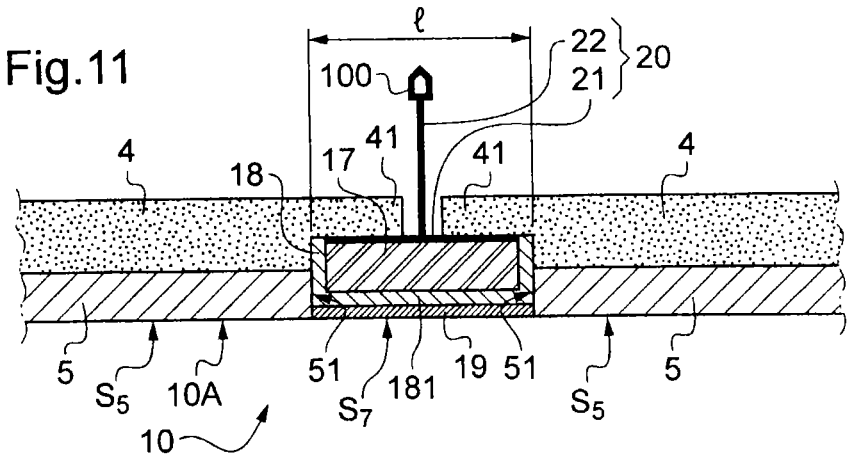

FIGS. 9, 10 and 11 illustrate variants of the embodiments in FIGS. 3, 4 and 6, respectively, in which variants the luminous joint forming means are fastened, not directly to the cladding panels 4 supporting the OLED devices 5, but to framework elements that allow the cladding panels 4 to be fastened to the bearing structure 100 supporting the luminous panel. More precisely, in each of FIGS. 9, 10 and 11, the two juxtaposed cladding panels 4 are connected to the bearing structure 100 by a profile 20 with a T-shaped cross section that acts as a framework element. Such an arrangement with T-shaped profiles is conventionally used to fasten ceiling tiles to a bearing structure. As may clearly be seen in FIGS. 9 to 11, the horizontal bar 21 of the T-shaped profile 20 bears against the front faces of the thin edges 41 of the two juxtaposed cladding panels 4, whereas the vertical bar 22 of the T-shaped profile 20 passes between the two cladding panels 4 in order to be connected, at the back of the cladding panels 4, to the bearing structure 100.

The luminous joint forming means are then positioned at the front of the horizontal bar 21 of the T-shaped profile 20 and may be fastened to said bar. In particular, in FIGS. 9 and 10, the prism 8 is positioned with its base 81 resting on the horizontal bar 21 of the T-shaped profile 20 such that a first reflective surface 82 of the prism faces the edge 51 of one of the OLED devices 5, whereas a second reflective surface 83 of the prism faces the edge 51 of the other OLED device 5. In FIG. 11, the light-emitting strip 18 is folded into a U shape around a filling block 17 positioned bearing against the horizontal bar 21 of the T-shaped profile 20.

Of course, T-shaped profiles may also be used with the luminous joint forming means shown in FIG. 8, which means comprise a system for providing illumination via an edge face, the scattering plate 28 then being positioned making contact with the edges 51 of the OLED devices 5 and with its back face placed facing the horizontal bar 21 of the T-shaped profile.

As is clear from the embodiments described above, a luminous panel according to the invention allows a large luminous area to be obtained the appearance of which is uniform both in the "on" state and in the "off" state, even in the junction between two separate juxtaposed OLED devices. In a very advantageous way, a luminous panel according to the invention can be easily integrated with a conventional framework system of a building wall, in particular a framework system for an internal wall or a ceiling, thereby making it particularly easy to form a building wall providing a lighting function.

The invention is not limited to the embodiments described and shown. In particular, the or each OLED device support of a luminous panel according to the invention may be a support other than a plasterboard. Any support able to be incorporated into a building wall can be used in the context of the invention, including, by way of nonlimiting example, glass wool sheets, melamine panels, chipboard panels, panels made of natural wood, metal sheets. In particular, when the luminous panel comprises a plurality of OLED device supports juxtaposed next to one another, these supports may all have the same nature or they may have different natures. Thus, in the embodiment in FIG. 1, the luminous panel 10 may comprise, instead of a plurality of juxtaposed plasterboards, juxtaposed boards of different natures, for example plasterboards juxtaposed with wooden boards.

The coating of each intermediate zone of the luminous panel, which coating ensures the visual continuity of the panel when the OLED devices are in the "off" state, may also be of any type, especially a film added at the front of the luminous elements, as in the above examples, or even a thin film deposited on the luminous elements. The expression "luminous elements" is here understood to mean the luminous joint forming elements that emit light as primary or secondary sources, namely the prism 8, the light-emitting strip 18 and the scattering plate 28 in the preceding examples.

Figure 12:
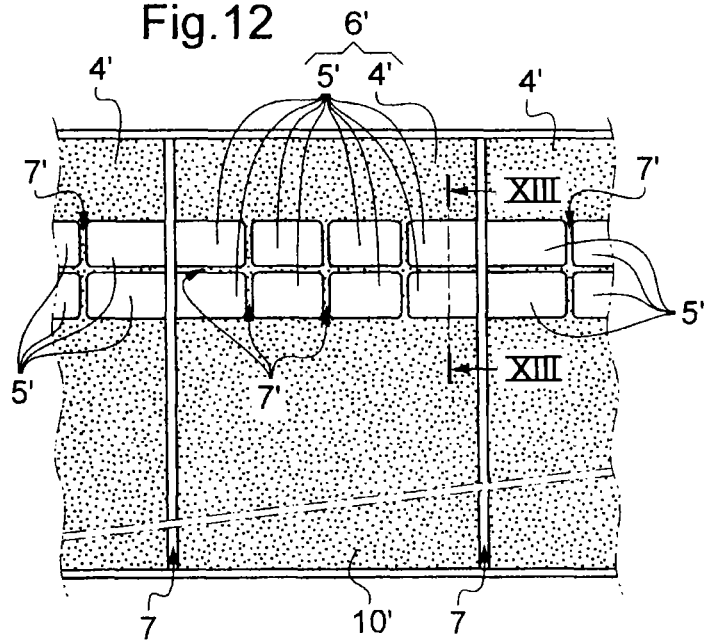
FIG. 12 is a front view of a variant of the luminous panel in FIG. 1.
Figure 13:
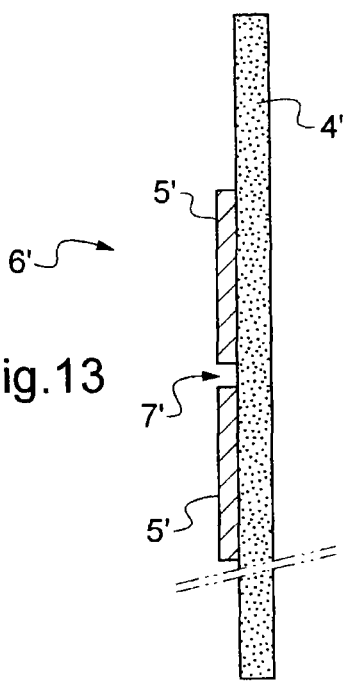
FIG. 13 is a partial cross-section along the line XIII-XIII in FIG. 12.

Moreover, in the above embodiments, each luminous board 6 is obtained by covering the support with a single OLED device, the junction regions 7 between two OLED devices 5 corresponding each time to the junction between two juxtaposed luminous panels 6. As a variant, and in particular when the size of the desired luminous area on the luminous board exceeds the maximum available OLED device size, a luminous plate may be obtained by covering a support with a plurality of juxtaposed OLED devices. This case is illustrated in FIGS. 12 and 13, which show a luminous panel 10' obtained by assembling luminous boards 6', where each luminous board 6' comprises a cladding panel 4' covered, in an upper part of one of its main faces, with a plurality of rigid or flexible OLED devices 5' forming a grid. The luminous panel 10' obtained by juxtaposing these luminous boards 6' exhibits visual discontinuities not only in each junction region 7 between two juxtaposed luminous boards 6' but also in each junction region 7' between two OLED devices 5' juxtaposed on each of the panels 4'. Luminous joint forming means such as described above, with reference to FIGS. 3 to 8, for ensuring visual continuity in the junction regions 7 may also be used to ensure visual continuity in the junction regions 7'.

Finally, the invention was illustrated in FIGS. 1 and 2 in the case of a framework of a demountable internal wall. However, the invention also applies to other types of frameworks. In particular, a luminous panel according to the invention may also be used to produce a ceiling, the panel then generally being connected to a structure produced under a floor. The cladding panels, which in this case are called ceiling tiles, may especially be connected to the structure by way of T-shaped profiles, as shown in FIGS. 9 to 11.

EXAMPLES

Example No. 1 Comparative Example

The two OLED devices 5 are two rectangular "Lumiblade Tall White" components from Philips arranged on two juxtaposed plasterboard supports. In the "off" state, each OLED device 5 looks like a mirror. The intermediate zone S₇ between the two OLED devices 5 has a width l of 12 mm and a length L of 48 mm. Under the experimental component power supply conditions, the mean luminance of each OLED device 5 is $L_m$=750 cd/m².

No luminous joint is added in the junction region 7 between the two OLED devices 5.

In this example, the intermediate zone S₇ is a zone of discontinuity between the two emitting zones S₅, which discontinuity is black in color and very clearly perceptible, both when the two OLED devices 5 are in the "off" state and when they are in the "on" state.

Example No. 2

The two OLED devices 5 are two rectangular "Lumiblade Tall White" components from Philips arranged on two juxtaposed plasterboard supports. In the "off" state, each OLED device 5 looks like a mirror. To meet the aesthetic requirements of the application, the OLED devices 5 and the junction region 7 are covered with a standard translucent film chosen from the "Scotchtal" type from 3M. The intermediate zone S₇ between the two OLED devices has a width l of 7 mm and a length L of 48 mm. Under the experimental component power supply conditions, the mean luminance of each OLED device 5 is $L_m$=750 cd/m².

A prism 8 made of a transparent material, provided on its surface with a light-redirecting film of the OLF (optical lighting film) type from 3M is positioned in the junction region 7 between the two OLED devices 5, as shown in FIG. 3. The prism 8 has a height h of 4 mm.

Example No. 3

The two OLED devices 5 are two rectangular "Lumiblade Tall White" components from Philips arranged on two juxtaposed plasterboard supports. In the "off" state, each OLED device 5 looks like a mirror. The intermediate zone S₇ between the two OLED devices 5 has a width l of 12 mm and a length L of 48 mm. Under the experimental component power supply conditions, the mean luminance of each OLED device 5 is $L_m$=750 cd/m².

A system for providing illumination via an edge face is placed at the back of the intermediate zone S₇, as shown in FIG. 8, this system comprising:
- a 2 mm-thick scattering plate 28 made of transparent "Planilux" clear glass from Saint-Gobain Glass having a pattern forming an extraction gradient screen printed on its back face 281; and
- a "Luxeon Rebel" LED 25 from Philips having a color temperature of 2700 K Rebel, coupled to the edge face 285 of the scattering plate 28.

A film formed by a semi-reflective layer 29 made of Mylar is positioned in front of the junction region 7 flush with the front faces of the two OLED devices 5, as shown in FIG. 8.

The choice of the power supply properties of the LED 28 are correlated with the absorption and transmission properties of the scattering plate so as to ensure the visual continuity in terms of luminance. In particular, in this example, the LED 25 is supplied with a current of 350 mA at a voltage of 2.8 V.

The optical characteristics of the luminous panels of examples No. 1 to 3 are given in table 1 below.

TABLE 1

| | "Off" state | "On" state | | |
|---|---|---|---|---|
| | $\Delta L/L_m$ (%) | $\Delta E$ (%) | $\Delta L/L_m$ (%) | Criterion of the MacAdam ellipses |
| Example No. 1 | | | | The intermediate zone is a zone of discontinuity that is black in color |
| Example No. 2 | <2 | <1 | 6 | Meets the criterion: the (u', v') coordinates of the intermediate zone are inside the MacAdam ellipse 14 centered on the coordinates (u' = 0.257, v' = 0.527) of each of the two emitting zones |
| Example No. 3 | 8 | 2 | 5 | Meets the criterion: the (u', v') coordinates of the intermediate zone are inside the MacAdam ellipse 14 centered on the coordinates (u' = 0.257, v' = 0.527) of each of the two emitting zones |

The quantities in table 1 were measured in the following way:

"On" state: the measurements are carried out using an LC Lumicam 1300-202 video photocolorimeter. The OLED devices 5 are placed a distance of 0.5 m away from the camera. The objective used is a 28 mm objective, the aperture of the diaphragm is 2.8. The luminance values measured correspond to the values along the axis perpendicular to the plane of the components.

"Off" state: the L, a* and b* values are measured at normal incidence using a Minolta CM-2700d spectrometer.

The invention claimed is:

1. A luminous panel comprising:
    at least two juxtaposed OLED devices that form a front face of the luminous panel and define two light-emitting zones separated by an intermediate zone; and
    luminous joint forming means that ensure, when the two OLED devices are in an on state, visual continuity between the intermediate zone and the two emitting zones, the luminous joint forming means being located at a back of or flush with the front face of the luminous panel
    wherein the luminous joint forming means comprises a redirecting prism placed at the back of the intermediate zone between two adjacent edges of the two juxtaposed OLED devices, a first reflective surface of the prism facing the edge of one of the two OLED devices whereas a second reflective surface of the prism faces the edge of the other OLED device to redirect light emitted by at least one of the two OLED devices toward a front of the intermediate zone.

2. The luminous panel as claimed in claim 1, wherein each OLED device is joined to a structural element of a building wall.

3. The luminous panel as claimed in claim 1, wherein, when the two OLED devices are in the on state, the relative difference in luminance, expressed in the CIE (L, u', v') color coordinate system, between the intermediate zone and each of the two emitting zones is smaller than 10%.

4. The luminous panel as claimed in claim 1, wherein, when the two OLED devices are in the on state, the color coordinates (u', v') of the intermediate zone are inside the MacAdam ellipse centered on the color coordinates (u', v') of each of the two emitting zones.

5. The luminous panel as claimed in claim 1, wherein the intermediate zone has a maximum width, measured perpendicularly to adjacent edges of the emitting zones, smaller than or equal to 2 cm.

6. The luminous panel as claimed in claim 1, further comprising a covering of the intermediate zone, such that there is visual continuity between the intermediate zone and the two emitting zones when the two OLED devices are in an off state.

7. The luminous panel as claimed in claim 1, wherein, when the two OLED devices are in an off state, the relative difference in luminance, expressed in the CIE (L, a*, b*) color coordinate system, between the intermediate zone and each of the two emitting zones is smaller than 10%.

8. The luminous panel as claimed in claim 1, wherein, when the two OLED devices are in the off state, the color difference, expressed in the CIE (L, a*, b*) color coordinate system, between the intermediate zone and each of the two emitting zones is smaller than 2.

9. The luminous panel as claimed in claim 1, comprising a support, the two OLED devices being juxtaposed on one face of the support.

10. The luminous panel as claimed in claim 1, comprising two juxtaposed supports, each support being covered with one of the two OLED devices.

11. The luminous panel as claimed in claim 10, wherein the luminous joint forming means is fastened to a framework element allowing one or each OLED device support to be fastened to a bearing structure.

12. A luminous panel, comprising:
at least two juxtaposed OLED devices that form a front face of the luminous panel and define two light-emitting zones separated by an intermediate zone; and
luminous joint forming means that ensure, when the two OLED devices are in an on state, visual continuity between the intermediate zone and the two emitting zones, the luminous joint forming means being located at a back of or flush with the front face of the luminous panel,
wherein the luminous joint forming means comprises a light-emitting strip placed in, or at a back of, the intermediate zone.

13. A luminous panel, comprising:
at least two juxtaposed OLED devices that form a front face of the luminous panel and define two light-emitting zones separated by an intermediate zone, the two OLED devices being supported on at least one support; and
luminous joint forming means that ensure, when the two OLED devices are in an on state, visual continuity between the intermediate zone and the two emitting zones, the luminous joint forming means being located at a back of or flush with the front face of the luminous panel,
wherein the luminous joint forming means includes a machined portion of a support of the at least one support that supports at least one of the two OLED devices, the machined portion creates a thinned portion of the support behind the two OLED devices, the machined portion of the support forming a reflective surface positioned, at a back of the intermediate zone, facing one edge of at least one of the OLED devices, to redirect light emitted by the OLED device toward a front of the intermediate zone.

14. A luminous panel, comprising:
at least two juxtaposed OLED devices that form a front face of the luminous panel and define two light-emitting zones separated by an intermediate zone; and
luminous joint forming means that ensure, when the two OLED devices are in an on state, visual continuity between the intermediate zone and the two emitting zones, the luminous joint forming means being located at a back of or flush with the front face of the luminous panel,
wherein the luminous joint forming means comprises scattering means for scattering light emitted by a light source toward a front of the intermediate zone, and
wherein the light source is an external light source coupled to an edge face of a scattering plate, the scattering plate being placed in or at a back of the intermediate zone, a main face of the scattering plate oriented toward a front of the intermediate zone being configured to extract at least some of the light emitted by the external light source.

15. The luminous panel as claimed in claim 14, wherein the scattering plate comprises, on one of its main faces, a pattern for extracting light emitted by the external light source.

16. A building wall, comprising a luminous panel as claimed in claim 1.

17. The luminous panel as claimed in claim 11, wherein the framework element has a T-shaped profile that extends between the supports to be fastened to the bearing structure.

18. The luminous panel as claimed in claim 12, wherein the two OLED devices are each supported by a support and the luminous joint forming means is fastened to a framework element allowing the supports to be fastened to a bearing structure.

19. The luminous panel as claimed in claim 13, wherein the two OLED devices are folded along the thinned portion of the support.

20. The luminous panel as claimed in claim 15, wherein the pattern on the scattering plate is a screen-printed extracting pattern.

* * * * *